US009559883B2

(12) United States Patent  
Eliezer

(10) Patent No.: US 9,559,883 B2  
(45) Date of Patent: Jan. 31, 2017

(54) POWER EFFICIENT DIGITAL WIRELESS TRANSMITTER AND METHOD OF OPERATION THEREOF

(71) Applicant: Tallannquest LLC, Garland, TX (US)

(72) Inventor: Oren E. Eliezer, Plano, TX (US)

(73) Assignee: Tallannquest LLC, Garland, TX (US)

( * ) Notice: Subject to any disclaimer, the term of this patent is extended or adjusted under 35 U.S.C. 154(b) by 0 days.

(21) Appl. No.: 14/940,840

(22) Filed: Nov. 13, 2015

(65) Prior Publication Data

US 2016/0142230 A1    May 19, 2016

Related U.S. Application Data

(60) Provisional application No. 62/079,938, filed on Nov. 14, 2014.

(51) Int. Cl.
*H04B 1/04* (2006.01)
*H04L 25/49* (2006.01)

(52) U.S. Cl.
CPC ......... *H04L 25/4902* (2013.01); *H04B 1/0475* (2013.01); *H04B 2001/045* (2013.01); *H04B 2001/0425* (2013.01)

(58) Field of Classification Search
CPC ........... H04B 1/02; H04B 1/04; H04B 1/0408; H04B 1/0416; H04B 1/0425; H04B 1/0433; H04B 1/045; H04B 1/0483; H04B 14/02; H04B 14/023; H04B 14/008; H04B 2001/0491; H04L 27/02; H04L 27/04; H04L 27/20; H04L 27/2032; H04L 27/2627; H04L 27/36; H04L 25/4902

USPC ....... 375/238, 239, 295, 259, 296, 285, 309, 375/312

See application file for complete search history.

(56) References Cited

U.S. PATENT DOCUMENTS

| | | | | |
|---|---|---|---|---|
| 2003/0058956 | A1* | 3/2003 | Rosnell | H03F 3/217 375/295 |
| 2004/0151257 | A1* | 8/2004 | Staszewski | H03F 1/0211 375/296 |
| 2007/0190952 | A1* | 8/2007 | Waheed | H04B 1/0475 455/114.3 |
| 2009/0004981 | A1* | 1/2009 | Eliezer | H03F 1/0211 455/127.1 |
| 2010/0278228 | A1* | 11/2010 | Vromans | H03F 3/24 375/238 |
| 2011/0007794 | A1* | 1/2011 | Vromans | H03F 1/34 375/238 |

(Continued)

*Primary Examiner* — Siu Lee

(57) ABSTRACT

A digital wireless transmitter and a method of transmitting a high-power modulated RF signal using a digital wireless transmitter are provided. In one embodiment, the transmitter includes: a digital system-on-a-chip configured to receive a complex digital input signal and having: an all-digital phase-locked loop and digital pulse modulator configured to modulate a phase and frequency modulation signal based on the complex digital input signal to yield a modulated complex signal, a driver configured to generate a pulse-position-modulated and pulse-width-modulated pulse train based on an instantaneous phase and amplitude of the modulated complex signal and a power supply modulation control block configured to develop an amplitude modulation control signal based on the complex digital input signal that defines a non-constant-envelope for an output signal of the transmitter.

20 Claims, 2 Drawing Sheets

(56) References Cited

U.S. PATENT DOCUMENTS

2015/0098521 A1*  4/2015  Beidas ............... H04B 7/18517
                                                    375/296
2015/0229364 A1*  8/2015  Kim ...................... H04J 11/003
                                                    370/329

* cited by examiner

POWER EFFICIENT DIGITAL WIRELESS TRANSMITTER AND METHOD OF OPERATION THEREOF

CROSS-REFERENCE TO RELATED APPLICATION

This application claims the benefit of U.S. Provisional Application Ser. No. 62/079,938, filed by Eliezer on Nov. 14, 2014, entitled "Power-Efficient Digital Wireless Transmitter," commonly assigned with this application and incorporated herein by reference.

TECHNICAL FIELD

This application is directed, in general, to digital wireless data transmission and, more specifically, to a power-efficient digital wireless transmitter and method of operating the same.

BACKGROUND

Wireless telemetry systems are automated networks for making measurements using sensors of various kinds and transmitted data reflecting the measurements using relatively wideband wireless transmitters to receiving equipment for monitoring. Because they are typically placed at remote or inaccessible locations, the sensors and transmitters are often battery-powered. Thus, transmitter power consumption is an important consideration. For this reason, most telemetry systems use constant-amplitude modulation schemes for their wideband wireless transmitters, where saturated/switched amplifiers may be used in the final high-power stage to provide relatively high power efficiency.

SUMMARY

One aspect provides a digital wireless transmitter. In one embodiment, the transmitter includes: (1) a digital system-on-a-chip configured to receive a complex digital input signal and having: (1a) an all-digital phase-locked loop and digital pulse modulator configured to modulate a phase and frequency modulation signal based on the complex digital input signal to yield a modulated complex signal, (1b) a driver configured to generate a pulse-position-modulated and pulse-width-modulated pulse train based on the instantaneous phase and amplitude of the modulated complex signal and (1c) a power supply modulation control block configured to develop an amplitude modulation control signal based on the complex digital input signal that defines a non-constant envelope for an output signal of the transmitter, the all-digital phase-locked loop and digital pulse modulator and the power supply modulation control block respectively providing separate pulse-width modulation and power supply modulation functions that combine to yield a desired envelope for the output signal and (2) high-power module having: (2a) a power amplifier configured to amplify the pulse-position-modulated and pulse-width-modulated pulse train to provide the output signal and (2b) a regulator coupled to the power amplifier and configured to apply the non-constant envelope to the output signal.

Another aspect provides a method of transmitting a high-power modulated RF signal using a digital wireless transmitter. In one embodiment, the method includes: (1) receiving a complex digital input signal, (2) modulating a phase and frequency modulation signal based on the complex digital input signal, (3) generating a pulse-position-modulated and pulse-width-modulated pulse train based on the modulating phase and amplitude signals, (4) developing an amplitude modulation control signal based on the complex digital input signal that defines a non-constant envelope for an output signal of the transmitter, (5) amplifying the pulse-position-modulated and pulse-width-modulated pulse train to provide the output signal and (6) applying the non-constant envelope to the output signal, said generating and said developing cooperating to provide amplitude modulation and yield a desired envelope for said output signal.

BRIEF DESCRIPTION

Reference is now made to the following descriptions taken in conjunction with the accompanying drawings, in which.

DETAILED DESCRIPTION

Figure 1:
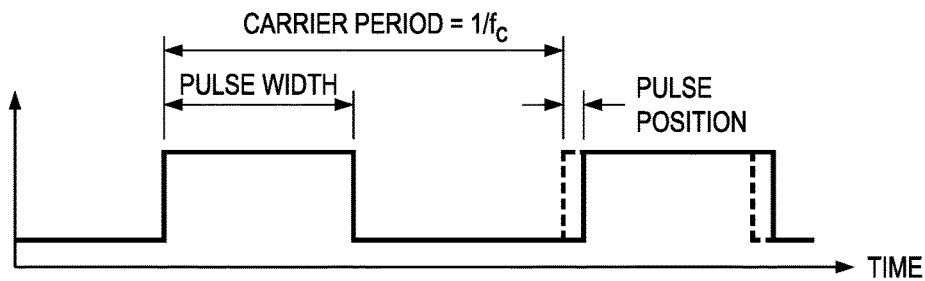
FIG. 1 is a diagram illustrating an example digital signal that may be used to drive a switched power stage from which a modulated RF signal may be produced at high power.

As stated above, the wireless transmitters of most telemetry systems use constant-amplitude modulation schemes, where saturated/switched amplifiers may be used in the final high-power stage to provide relatively high power efficiency. However, it is recognized herein that with constant-amplitude modulation, the spectral efficiency of the modulated signal is limited, which is undesirable as the spectrum available for telemetry is becoming a scarce resource. It is therefore realized herein that a power-efficient wireless transmitter should also be more spectrally efficient. More specifically, it is realized herein that a wireless transmitter using a more complex non-constant-amplitude envelope would be advantageous in telemetry applications due to its higher spectral efficiency.

Accordingly, disclosed herein are a transmitter and a method, including signal-processing algorithms, intended to offer a highly integrated and cost-effective solution for wideband transmitters.

The power levels targeted for the transmitter embodiments disclosed herein are on the order of watts rather than milliwatts, such that they are assumed to be high enough to exceed what may be produced by a low-voltage complementary metal-oxide semiconductor (CMOS) integrated circuit (IC), where the majority of a conventional digital transmitter is implemented. An exemplary apparatus therefore includes a modulator that is implemented extensively digitally in a CMOS IC, and an additional power stage that is external to the IC. The additional power stage may include one or more power stages and may be implemented in a different technology, such as Gallium Nitride (GaN).

To produce relatively high output power levels at relatively high efficiency, the output stages of the transmitter embodiments disclosed herein are designed to operate in switched mode (e.g., class-E/class-F operation). As a result, various kinds of distortion may be expected, such as amplitude-dependent delays, which represent amplitude-to-phase modulation distortion (amplitude modulation, or AM, to phase modulation, or PM). In the transmitter embodiments disclosed herein, relief for these distortions is achieved through the use of feedback circuitry and signal processing algorithms that characterize the amount of distortion experienced and apply compensation in the digital domain, where the modulation is implemented.

The creation of the modulated single-carrier signal is achieved fully digitally through the use of sufficiently fine control of the timing and width of pulses having a fundamental rate that is equal (or related) to the desired carrier frequency. The harmonic content of such pulsed/switching signal would be suppressed by the filtering network of the switched-mode output stage, while the in-band spectrum would contain the desired modulated carrier.

The timing resolution of the digital phase-modulation operation determines the modulation inaccuracy and the deviation of the spectrum of the modulated signal from an ideal one. For example, at a carrier frequency of 2.778 GHz, corresponding to a period of 360 ps, a timing resolution of 1 ps corresponds to 1° of phase resolution. In addition to digitally controlling the timing of pulses, in a possible embodiment, additional phase modulation may be applied through the frequency-control input of an all-digital phase-locked loop (ADPLL).

The applications for the transmitter or method embodiments described herein go beyond telemetry systems, since the range of output power levels, the frequency bands and the data-rates that it may accommodate are applicable in cellular/WiFi infrastructure systems, point-to-point communication systems of various types, remote monitoring, backhaul links, satellites, and other communication systems.

FIG. 1 is a diagram illustrating an example digital signal that may be used to drive a switched power stage from which a modulated RF signal may be produced at high power. The digital modulator can control the width of each pulse, as well as its timing, to create both phase and amplitude modulation that would be apparent on the filtered modulated carrier at the output of the transmitter. The resulting signal therefore employs both pulse-position modulation (PPM) for phase modulation and pulse-width-modulation (PWM) for amplitude modulation to achieve complex modulation in a switched power stage.

In one embodiment, the PWM operation may be combined with power supply modulation to create the output signal in a power-efficient manner, while considering the limitations that each of these amplitude-modulation mechanisms may have.

Figure 2:
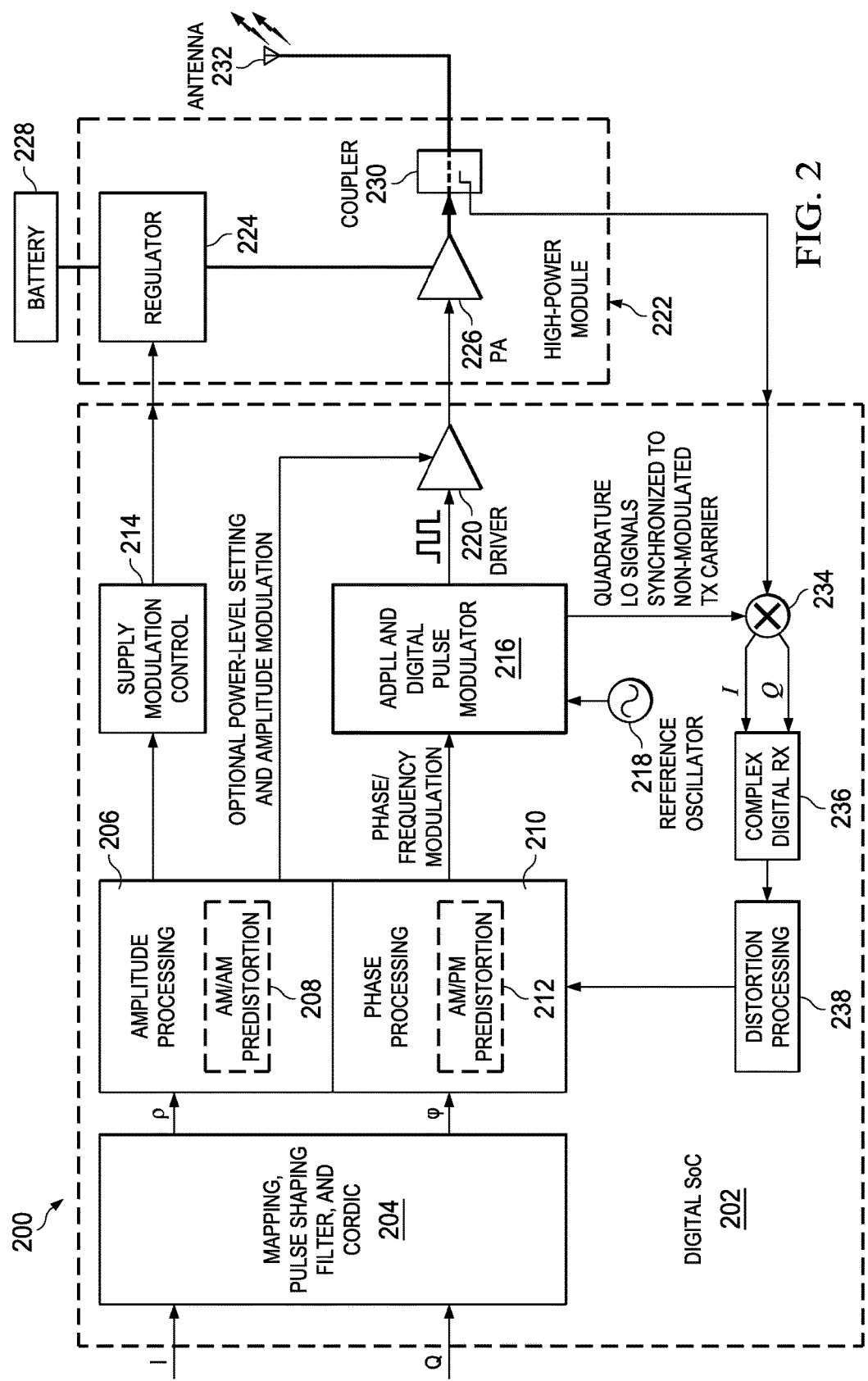
FIG. 2 is a block diagram of one embodiment of a power-efficient digital wireless transmitter.

FIG. 2 is a block diagram of one embodiment of a power-efficient digital wireless transmitter 200. A digital modulator and processor, implemented in the illustrated embodiment as a CMOS digital system-on-a-chip (SoC) 202 may include a digital signal processor (DSP) and memory, as well as other functional blocks, that may be shared with other functions of the transmitter 200 or a larger system. In the embodiment of FIG. 2, the SoC 202 is configured to receive components of a complex digital input signal, namely in-phase and quadrature components I and Q. An input block 204 is configured to receive the in-phase and quadrature components I and Q, map them to corresponding digital values, pulse-shape the quadrature components and provide a COordinate Rotation DIgital Computer (CORDIC) function to convert the quadrature components into polar amplitude and phase components $\rho$ and $\phi$. The amplitude component $\rho$ is provided to an amplitude processing block 206 configured to provide an amplitude modulation signal that governs a power supply modulation control block 214, and a second amplitude modulation signal to a pulse-width modulator and driver 220, such that the combination of both amplitude modulating signals yields the desired envelope for the modulated output signal. The power supply modulation control block 214 is configured to provide an envelope tracking function. The amplitude processing block 206 further includes an AM/AM predistortion block 208 configured to predistort the signal governing the power supply modulation control block 214, and, in one embodiment, also the signal applied to the driver 220, based on feedback from the output of the transmitter 200.

The phase component $\phi$ is provided to a phase processing block 210 that produces a phase and frequency modulation signal that governs an ADPLL and digital pulse modulator 216. The phase processing block 210 further includes an AM/PM predistortion block 212 configured to predistort the phase and frequency modulation signal based on feedback from the output of the transmitter 200. A reference oscillator 218 is configured to provide a reference frequency to the ADPLL and digital pulse modulator 216. The ADPLL and digital pulse modulator 216 is configured to act as a local oscillator (LO) to generate a non-modulated transmission carrier for modulating the phase and frequency modulation signal to yield a PPM and PWM modulated output pulse train for preamplification by a pulse driver 220. In the embodiment of FIG. 2, the amplitude processing block 206 is further configured to operate as a power supply for the pulse driver 220, modulating the power of the pulse driver 220 to modulate the amplitude of its output.

A high-power module 222 is coupled to the SoC 202. The high-power module 222 includes a regulator 224, a power amplifier 226 and a coupler 230. The regulator 224 is configured to receive the output from the power supply modulation control block 214 and battery power from a battery 228 and provide regulated DC power to the power amplifier 226. The power amplifier 226 is configured to receive and further amplify the modulated output pulse train preamplified by the pulse driver 220 to produce an output signal and provide the output signal to an antenna 232 for wireless transmission.

The coupler 230 provides a coupling (an inductive coupling in one embodiment) to sample the output signal produced by the power amplifier 226 for purposes of predistorting for any distortions experienced in its amplitude or phase. A complex mixer 234 is configured to act as a downconverter to receive the feedback from the coupler 230 and, under control by quadrature LO signals synchronized to the non-modulated transmission carrier, produce in-phase and quadrature components I and Q of the feedback. In the illustrated embodiment, the quadrature LO signals are based on the same carrier frequency that is generated for the transmitter, such that frequency-synchronized down-conversion to baseband is achieved. Phase shifts experienced in the external power stage will result in variations in the ratio of the I and Q signals, allowing the digital receiver to quantify them through the calculation of the arctangent function: phase=arctan(Q/I).

A complex digital receiver 236 receives and processes the in-phase and quadrature components I and Q to produce an output which is further processed in a distortion processing block 238 to determine any predistortion needed to precompensate for distortions experienced in the amplitude or phase of the output signal. The output of the distortion processing block 238 is provided to the AM/AM predistortion block 208 and to the AM/PM predistortion block 212, such that dynamic adaptation of any look-up-tables or parameters that their operation may be based on is realized. Thus, the AM/AM predistortion block 208 and AM/PM predistortion block 212 provide a digital predistortion mechanism that is dynamically updated and applies the necessary digital compensation on the phase and amplitude modulation paths in the digital transmitter.

While the embodiment of FIG. 2 shows only a single pulse driver 220 coupled to a single power amplifier 226, alternative embodiments may employ multiple pulse drivers 220 coupled to corresponding power amplifiers 226. In such embodiments, each pulse driver 220 may drive a different pulse train. Each pulse train may contain different modulation in terms of position and duration (i.e. in phase and in amplitude), such that, when fed into multiple power stages (each of which operates as a switched stage), a desired vector sum is achieved. This is similar to the principle of conventional LINC (linear amplification with nonlinear components) amplifiers. The power stage in such embodiment may comprise switching elements that either produce the same power level (i.e. a unary array) or different levels of power (e.g., in a binary-weighted array or in an array of any other weighing). Thus, a digital-to-RF-power converter is realized, having a feedback system for the reduction of distortion.

Figure 3:
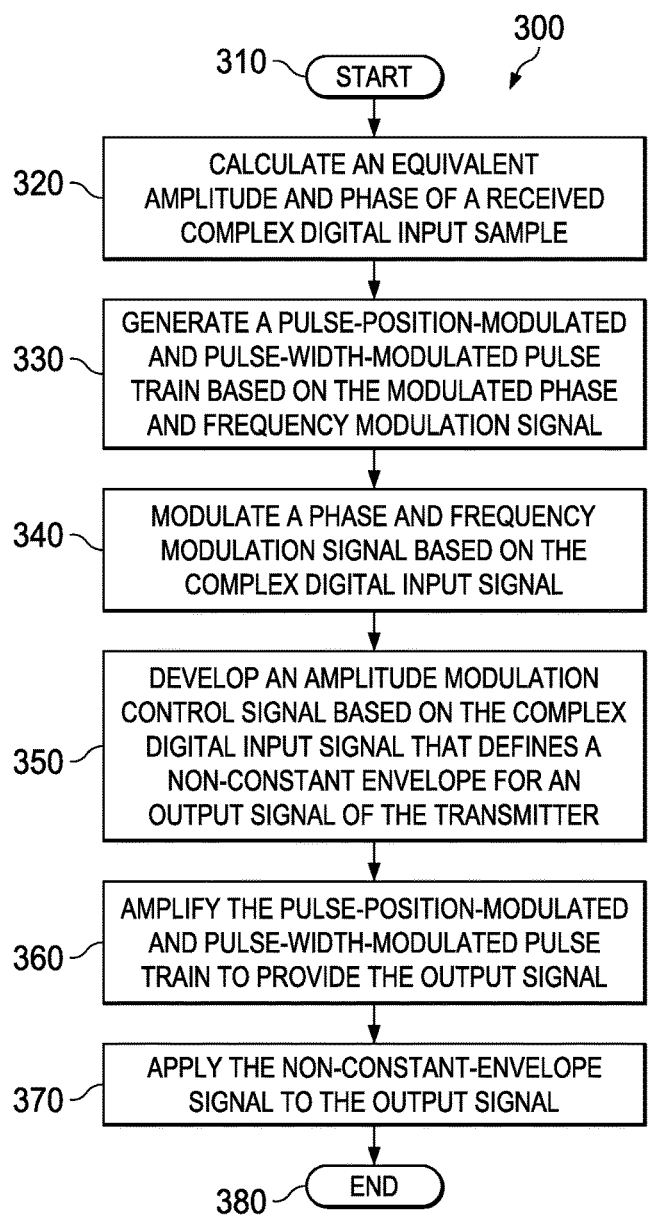
FIG. 3 is a flow diagram of one embodiment of a method of transmitting a high-power modulated RF signal using a power-efficient digital wireless transmitter.

FIG. 3 is a flow diagram of one embodiment of a method 300 of transmitting a high-power modulated RF signal using a power-efficient digital wireless transmitter. The method 300 begins in a start step 310. In a step 320, a complex digital input signal is read from the source generating the baseband signal that is to be transmitted, and the equivalent polar representation of that sample is computed. In a step 330, a phase and frequency modulation signal is modulated based on the complex digital input signal. In a step 340, a PPM and PWM modulated pulse train is generated based on the modulating phase and frequency modulation signal. In a step 350, an amplitude modulation control signal is developed based on the complex digital input signal. The amplitude modulation control signal defines a non-constant envelope for an output signal of the transmitter. In a step 360, the PPM and PWM modulated pulse train is amplified to provide the output signal. In a step 370, the non-constant envelope is applied to the output signal. The generating of the step 340 and the developing of the step 350 cooperate to provide amplitude modulation and yield a desired envelope for the output signal. The method 300 ends in an end step 380, which would typically be followed by the repeated sequence of operations for the processing of the next sample. The duration of the periodic operation starting at step 310 and ending at step 380 is typically a small fraction of the system's symbol time (e.g., 10% of it) to allow for sufficient oversampling and reliable representation of the continuous-time transmitted signal by means of a discrete-time version of it.

Those skilled in the art to which this application relates will appreciate that other and further additions, deletions, substitutions and modifications may be made to the described embodiments.

What is claimed is:

1. A digital wireless transmitter, comprising:
    a digital system-on-a-chip configured to receive a complex digital input signal and including:
        an all-digital phase-locked loop and digital pulse modulator configured to modulate a phase and frequency modulation signal based on said complex digital input signal to yield a modulated complex signal,
        a driver configured to generate a pulse-position-modulated and pulse-width-modulated pulse train based on an instantaneous phase and amplitude of said modulated complex signal, and
        a power supply modulation control circuitry configured to develop an amplitude modulation control signal that defines a non-constant envelope for an output signal of said transmitter based on said complex digital input signal, said all-digital phase-locked loop and digital pulse modulator and said power supply modulation control circuitry respectively providing separate pulse-width modulation and power supply modulation functions that combine to yield a desired envelope for said output signal; and
    a high-power module including:
        a power amplifier configured to amplify said pulse-position-modulated and pulse-width-modulated pulse train to provide said output signal, and
        a regulator coupled to said power amplifier and to said power supply modulation control circuitry and configured to apply said non-constant-envelope to said output signal.

2. The transmitter as recited in claim 1 wherein said digital system-on-a-chip further includes an amplitude distortion processing circuitry configured to apply an AM/AM predistortion to said pulse-width-modulated pulse train and to a signal provided to said power supply modulation control circuitry.

3. The transmitter as recited in claim 1 wherein said digital system-on-a-chip further includes a phase processing circuitry configured to apply an AM/PM predistortion to said phase and frequency modulation signal.

4. The transmitter as recited in claim 1 wherein said digital system-on-a-chip further includes an input circuitry configured to receive said complex digital input signal, comprising two real input signals (I and Q), map and pulse-shape said I and Q input signals and provide a Cartesian to polar conversion function to yield amplitude and phase components therefrom.

5. The transmitter as recited in claim 1 wherein said digital system-on-a-chip is a complementary metal-oxide semiconductor integrated circuit.

6. The transmitter as recited in claim 1 wherein said high-power module further includes a coupler coupled to said power amplifier and configured to provide a sample of said output signal produced by said power amplifier for purposes of predistorting for any distortions experienced in amplitude or phase thereof.

7. The transmitter as recited in claim 6 wherein said digital system-on-a-chip further includes a mixer configured to act as a downconverter to receive a feedback from said coupler and produce in-phase and quadrature components of said feedback.

8. The transmitter as recited in claim 7 wherein said all-digital phase-locked loop and digital pulse modulator is further configured to modulate said phase and frequency modulation signal using a local oscillator that provides a transmission carrier and wherein said mixer is configured to receive quadrature local oscillator signals synchronized to said transmission carrier, such that the complex signal that is produced by the downconversion of said feedback signal would reveal the phase relationship between a modulating phase signal and an actual phase of the transmitter's output signal.

9. The transmitter as recited in claim 1 wherein said regulator is battery-powered.

10. The transmitter as recited in claim 1 wherein said digital system-on-a-chip further includes multiple pulse drivers and said high-power module further includes corresponding multiple power amplifiers, each of said multiple pulse drivers configured to generate a different pulse train in terms of position and duration, such that, when fed into said multiple power amplifiers, a desired vector sum is achieved.

11. A method of transmitting a high-power modulated RF signal using a digital wireless transmitter, comprising:
   calculating an equivalent amplitude and phase of a received complex digital input signal;
   modulating a phase and frequency modulation signal based on said complex digital input signal;
   generating a pulse-position-modulated and pulse-width-modulated pulse train based on said modulated phase and frequency modulation signal;
   developing an amplitude modulation control signal that defines a non-constant-envelope for an output signal of said transmitter based on said complex digital input signal;
   amplifying said pulse-position-modulated and pulse-width-modulated pulse train to provide said output signal; and
   applying said non-constant-envelope signal to said output signal, said generating and said developing cooperating to provide amplitude modulation and yield a desired envelope for said output signal.

12. The method as recited in claim 11 further comprising applying an AM/AM predistortion to said pulse-width-modulated pulse train and to a signal provided to a power supply modulation control circuitry.

13. The method as recited in claim 11 further comprising applying an AM/PM predistortion to said phase and frequency modulation signal.

14. The method as recited in claim 11 further comprising:
   receiving said complex digital input signal in Cartesian coordinates (I and Q);
   mapping and pulse-shaping said complex digital input signal; and
   providing a COordinate Rotation DIgital Computer (CORDIC) function or other Cartesian to polar conversion method to yield equivalent amplitude and phase components.

15. The method as recited in claim 11 wherein said calculating, generating, modulating and developing are carried out in a complementary metal-oxide semiconductor integrated circuit.

16. The method as recited in claim 11 further comprising providing a coupler to sample said output signal produced by said power amplifier for purposes of predistorting for any distortions experienced in amplitude or phase thereof.

17. The method as recited in claim 16 further comprising:
   receiving a feedback from said coupler; and
   producing in-phase and quadrature components of said feedback.

18. The method as recited in claim 17 further comprising:
   modulating said phase and frequency modulation signal using a local oscillator that provides a transmission carrier; and
   employing local quadrature local oscillator signals synchronized to said transmission carrier for downconverting said feedback signal from transmitter's output.

19. The method as recited in claim 11 wherein said wireless transmitter is battery powered.

20. The method as recited in claim 11 further comprising generating different pulse trains in terms of position and duration such that when fed into multiple power amplifiers, a desired vector sum is achieved.

* * * * *